US006615481B1

(12) United States Patent
LaPlante et al.

(10) Patent No.: US 6,615,481 B1
(45) Date of Patent: Sep. 9, 2003

(54) METHOD FOR FABRICATION OF ELECTROMAGNETIC COIL VANES

(75) Inventors: Mark J. LaPlante, Montgomery, NY (US); David J. Pinckney, Newtown, CT (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/589,399

(22) Filed: Jun. 8, 2000

(51) Int. Cl.⁷ .............................. H01F 7/06; B05D 3/02
(52) U.S. Cl. ..................... 29/602.1; 29/606; 29/609; 427/383.1; 427/383.3; 427/259
(58) Field of Search ...................... 29/602.1, 608, 29/609, 606; 336/200, 221, 232; 250/396 ML, 396 R; 174/262; 427/383.1, 259, 265

(56) References Cited

U.S. PATENT DOCUMENTS

| 4,504,726 A | * | 3/1985 | Hosaka et al. ............... 219/121 |
| 5,091,286 A | * | 2/1992 | Person ......................... 430/297 |
| 5,922,514 A | * | 7/1999 | Person et al. ................ 430/311 |
| 6,153,885 A | * | 11/2000 | Kendall ................ 250/369 ML |
| 6,366,192 B2 | * | 4/2002 | Person et al. ................ 336/200 |
| 2001/0052467 A1 | * | 12/2001 | Pinckney ...................... 29/825 |

* cited by examiner

Primary Examiner—Carl J. Arbes
Assistant Examiner—Minh Trinh
(74) Attorney, Agent, or Firm—Whitman, Curtis & Christofferson, P.C.

(57) ABSTRACT

The present invention relates to a method of fabricating electromagnetic coil vanes. The method utilizes laser machining to provide high resolution, dense coil wire patterns on both sides of a ceramic vane substrate. A firing operation is first performed that eutectically bonds the copper to the ceramic. Laser machining is then used to produce a coil pattern in the copper. The substrate is drilled to provide a through hole which, when filled or partially filled with a conducting material, forms an electrical connection between the two coil patterns.

17 Claims, 8 Drawing Sheets

METHOD FOR FABRICATION OF ELECTROMAGNETIC COIL VANES

CROSS-REFERENCE TO RELATED APPLICATIONS

This application is related to U.S. patent application Ser. No. 09/324,899, filed Jun. 3, 1999, by Rodney Kendall for "Toroidal Charged particle Deflector With High Mechanical Stability and Accuracy", Ser. No. 09/325,162, filed Jun. 3, 1999, by Rodney Kendall and David Pinckney for "Fabrication Method of High Precision, Thermally Stable Electromagnetic Coil Vanes", and Ser. No. 09/471,613 filed Dec. 23, 1999, 1999, now U.S. Pat. No. 6,461,680, issued Oct. 8, 2002 by David Pinckney for "Simplified Fabrication Method of Toroidal Charged Particle Deflector Vanes", and assigned to a common assignee herewith. U.S. patent application Ser. Nos. 09/324,899, 09/325,162 and 09/471,613 are fully incorporated herein by reference.

BACKGROUND OF THE INVENTION

1. Field of the Invention

The present invention generally relates to Charged Particle Beam Projection Systems, and more particularly, to a laser-based method for fabricating high precision, thermally stable electromagnetic coil vanes used with Charged Particle Beam Projection Systems.

2. Background Description

Charged particle beam systems require a series of deflectors to control the path of electrons as they travel from their source (the electron gun) to their target (the electron sensitive resist being exposed). Ser. No. 09/324,899 discloses a toroidal style deflector composed of many individual coil vanes that provides high mechanical stability and accuracy. The fabrication of these coil vanes presents many challenges. They require uninsulated, low resistance (AWG 22–23) copper wiring, with a substantially rectangular cross-section. The copper wires must be precisely located upon and attached to both sides of a thin, insulating substrate with a low thermal coefficient of expansion. The wiring must be densely spaced (0.6 mm wide wires with 0.25 mm or less spaces) to provide sufficient performance. Moreover, the overall thickness of each coil vane should be a small as possible.

Ser. No. 09/325,162 describes one method to produce these coil vanes. Machined copper circuit patterns (approximately 0.5 mm thick) are mechanically aligned and bonded with a heat curable epoxy to both sides of a low expansion vane substrate. The process is somewhat complex, costly, and time consuming.

U.S. Pat. No. 6,461,680 describes a second method where the copper circuit pattern is formed via photolithography on a ceramic substrate and then plated and bonded. This process is less complex and less costly than that of Ser. No. 09/325, 162, and can produce coils with improved pattern placement accuracy. The elimination of the epoxy bonding agent also reduces the overall vane thickness. The limitation of this process is that present technology limits the maximum attainable plated copper thickness to approximately 0.13 mm.

SUMMARY OF THE INVENTION

It is therefore an object of the invention to provide a simplified, cost effective coil vane fabrication technique using laser machining which has the advantages of providing an improved coil placement accuracy and wire density.

It is yet another object of the invention to provide a method for fabricating high precision, thermally stable electromagnetic coil vanes that do not require specialized tooling or a bonding composition to align and clamp the copper coils.

According to the invention, a laser-based method is provided to fabricate high current capacity, high accuracy, thermally stable deflection yokes used to generate off axis beam deflections. In the preferred embodiment, electromagnetic coil vanes are formed having by combining selected steps of the direct bond copper (DBC) method with laser machining to produce thin, extremely accurate, coil vanes with equivalent wire gauge (AWG 22–23), improved wire density, and a substantially rectangular wire cross-section.

In a preferred embodiment, a substrate, preferably made of thin alumina ceramic and preferably having a thickness of approximately 0.64 mm or less, has approximately 0.5 mm copper sheets bonded to each side. The copper sheets and ceramic are heated in a furnace to the melting point of copper oxide (which is lower than the melt point of copper). The copper oxide then melts and forms a permanent, "eutectic" bond between the copper and the ceramic.

The coil pattern is then "laser machined" through the copper sheets on each side of the substrate. Laser machining can form spaces between adjacent wires or turns of less than 0.1 mm, whereas the technique of Ser. No. 09/325,162 required the minimum space between adjacent wires to be at least 0.25 mm. The method of the present invention thus enables denser and, therefore, higher efficiency coils to be produced. The cross-section of the copper wire pattern is substantially rectangular.

Following the laser machining, a hole is drilled through the vane and an electrical connection made between the circuits on either side of the ceramic vane. Alternatively, the through connection could be formed in a pre-drilled hole in the ceramic during the direct bond copper process

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
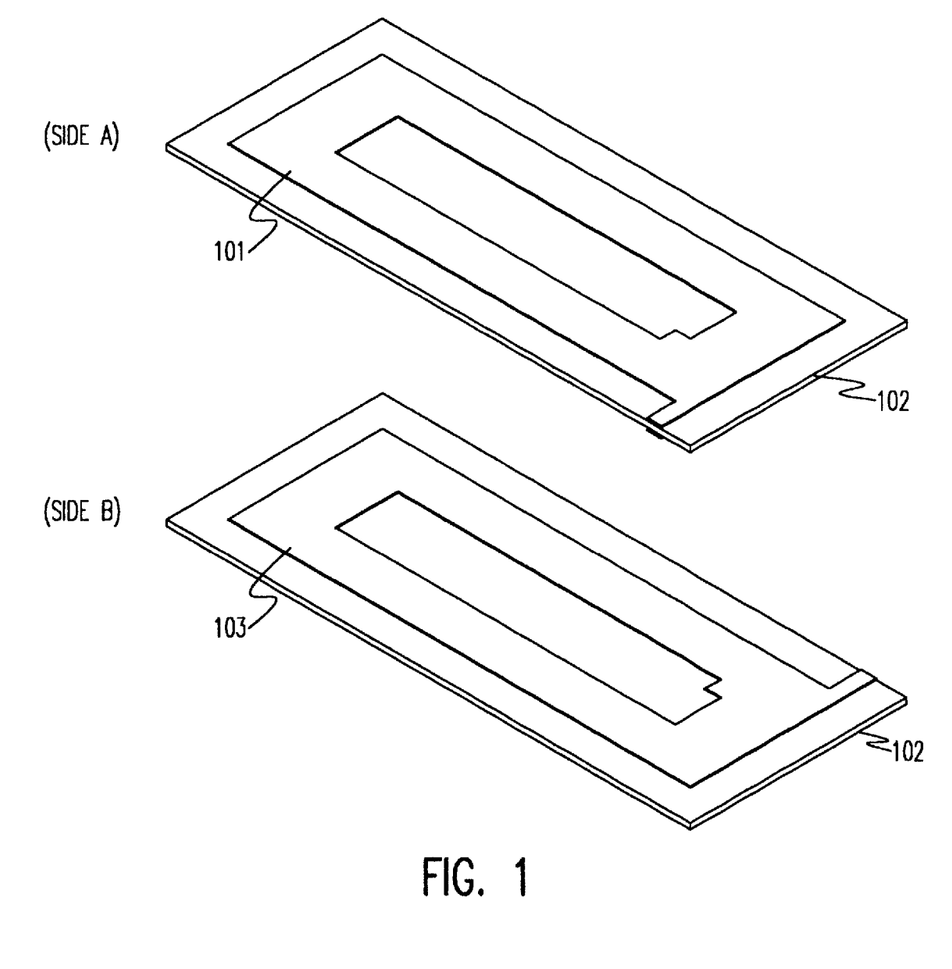
FIG. 1 shows the coil vane prior to laser machining.

Referring now to the drawings, FIG. 1 shows the coil vane prior to laser machining. In step 201 of FIG. 2, the ceramic substrate 102 shown in FIG. 1 is fabricated in accordance with conventional methods widely known to those skilled in the art. In a preferred embodiment, the substrate 102 is preferably made of alumina ceramic and preferably has a thickness of approximately 0.64 mm or less. The substrate 102 also preferably has a low coefficient of thermal expansion (CTE). For example, in a preferred embodiment, any particular ceramic can be used that has a CTE of approximately $7 \times 10^{-6}$/°C. Other substrate materials such as quartz may also be used with the present invention, depending on the particular application.

Figure 2:
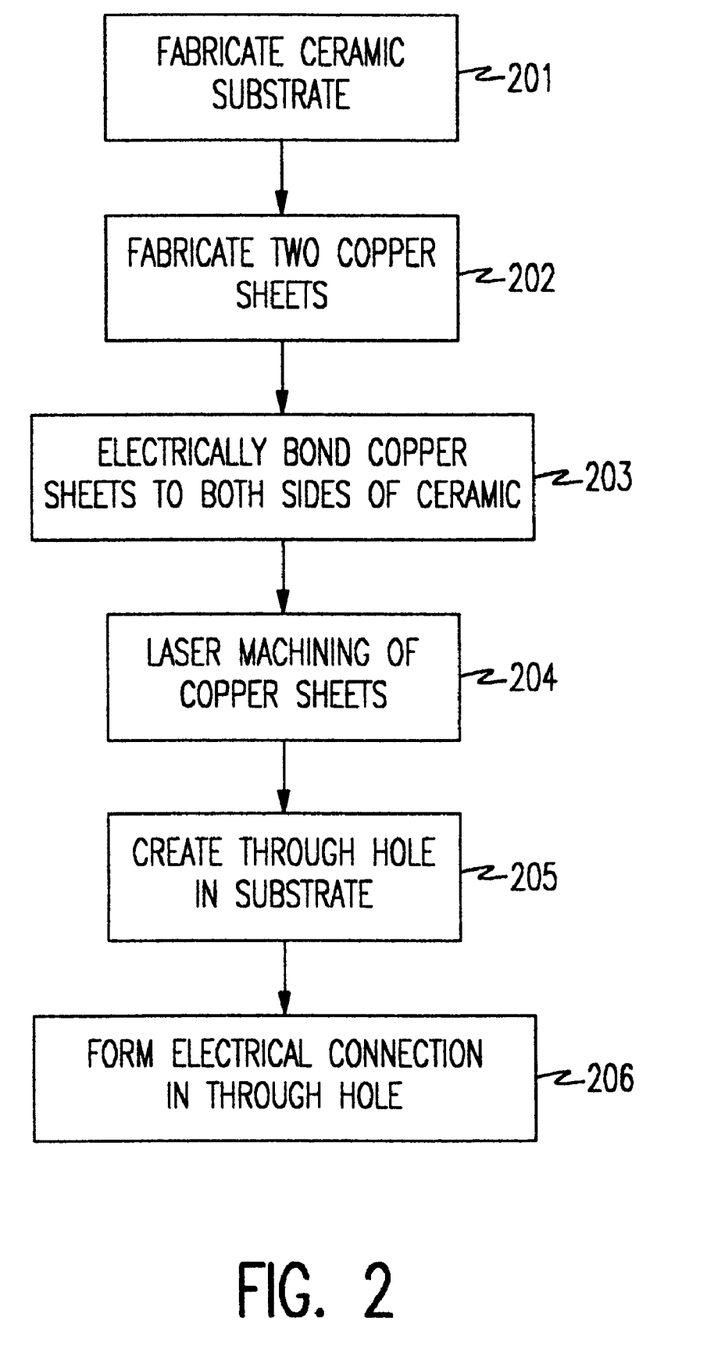
FIG. 2 is a flowchart of the method of the present invention.

In step 202 of FIG. 2, the conductive metal sheets 101, 103, preferably of copper or, possibly, silver, are fabricated. The copper sheets 101, 103, are preferably of approximately 0.5 mm in thickness, bonded to each side of the substrate 102.

The copper sheets 101, 103 are bonded to both sides of ceramic substrate 102 in accordance with step 203 shown in FIG. 2. In step 203, it is preferred that the substrate 102 and the copper layers 101, 103 are fired in a furnace to the melting point of copper oxide, which is just below the melting point of copper. More specifically, while other bonding techniques such as epoxy bonding can be used, it is preferred that the copper be heated to a temperature at a melting point of the eutectic composition of copper and the copper oxide that naturally forms on the copper. The eutectic composition of the copper and its oxide forms a bond with the substrate 102. It is preferred that the assembly be heated within a temperature range of 1065° C. (copper-copper oxide eutectic temperature) to 1083° C. (melting point of copper). It is preferred that the heating take place within an inert environment, such as nitrogen. The heating period must be sufficient to enable the temperature of the entire assembly to stabilize within 1065° C. to 1083° C. At this point, the eutectic composition of copper and the copper oxide that naturally forms on copper will become liquid, wet the surface of the substrate 102, and form a permanent bond between the copper sheets 101, 103 and the substrate 102. Cooling should be done in a gradual manner to minimize the internal thermal stress within the assembly.

In step 204, the coil pattern is then "laser machined" through the copper sheets 101, 103 on each side of the substrate 102. The laser machining forms spaces between adjacent wires of less than 0.1 mm thick, whereas the technique of Ser. No. 09/325,162 required the minimum space to be at least 0.25 mm. This method of the present invention thus enables denser and, therefore, higher efficiency coils to be produced.

Figures 3A, 3B:
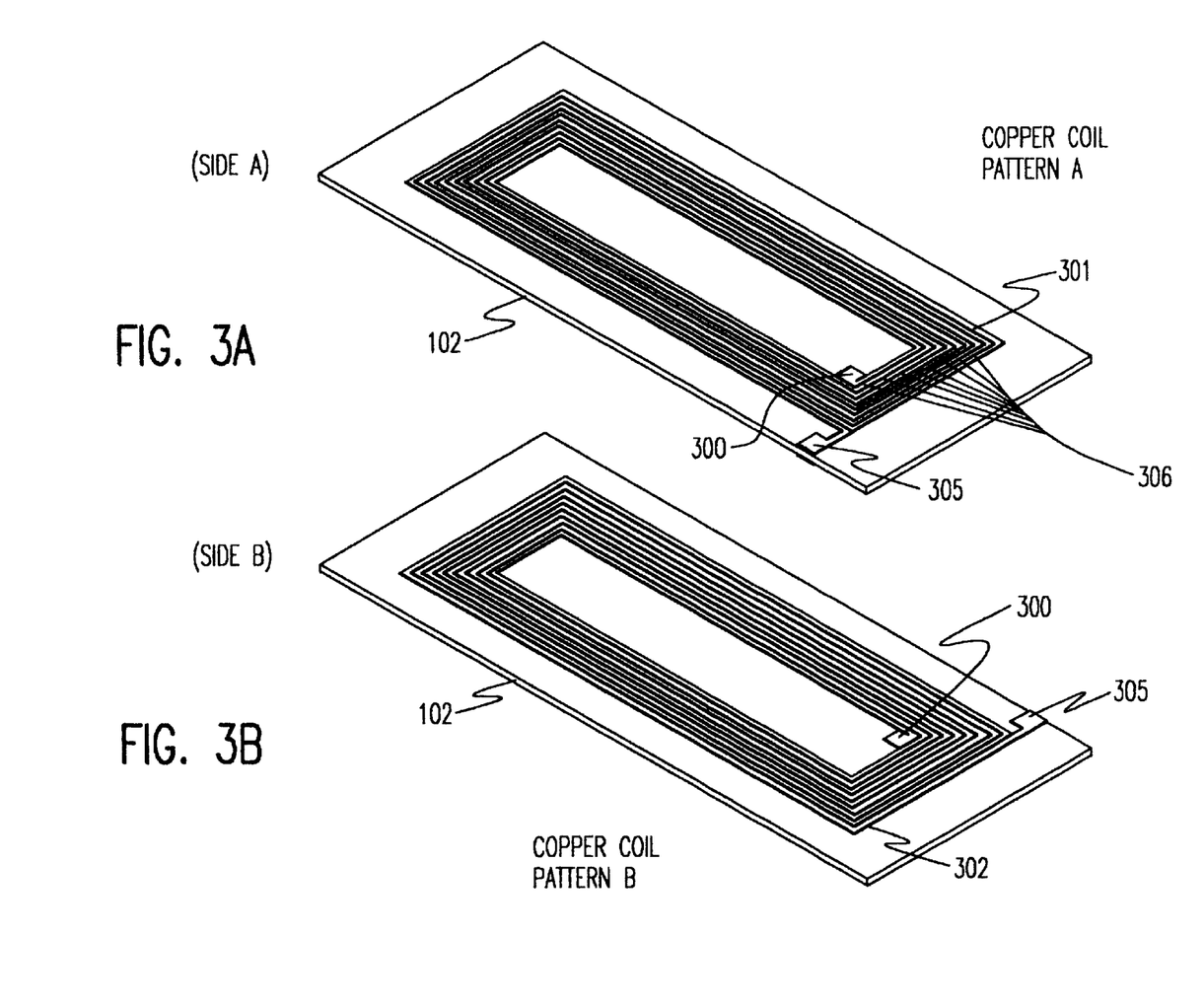
FIG. 3 shows the coil vane after laser machining.

In a preferred embodiment, shown in FIGS. 3A and 3B, the electromagnetic coil vane requires the formation of two complementary copper coil patterns 301 and 302 of approximately the same size and shape directly on the substrate, of preferably approximately 22–23 AWG, uninsulated rectangular cross section wire. The resulting cross-section of the copper wire pattern after the laser machining described herein is substantially rectangular with substantially vertical sidewalls. The kerf 306 (i.e., gaps) between the adjacent wires in wire patterns 301 and 302 must be as small as possible to maximize the copper wire pattern density and thus the effectiveness of the coil. The ratio of wire width to gap should be at least 2.5:1, and will preferably by at least 4:1.

Figure 6A:
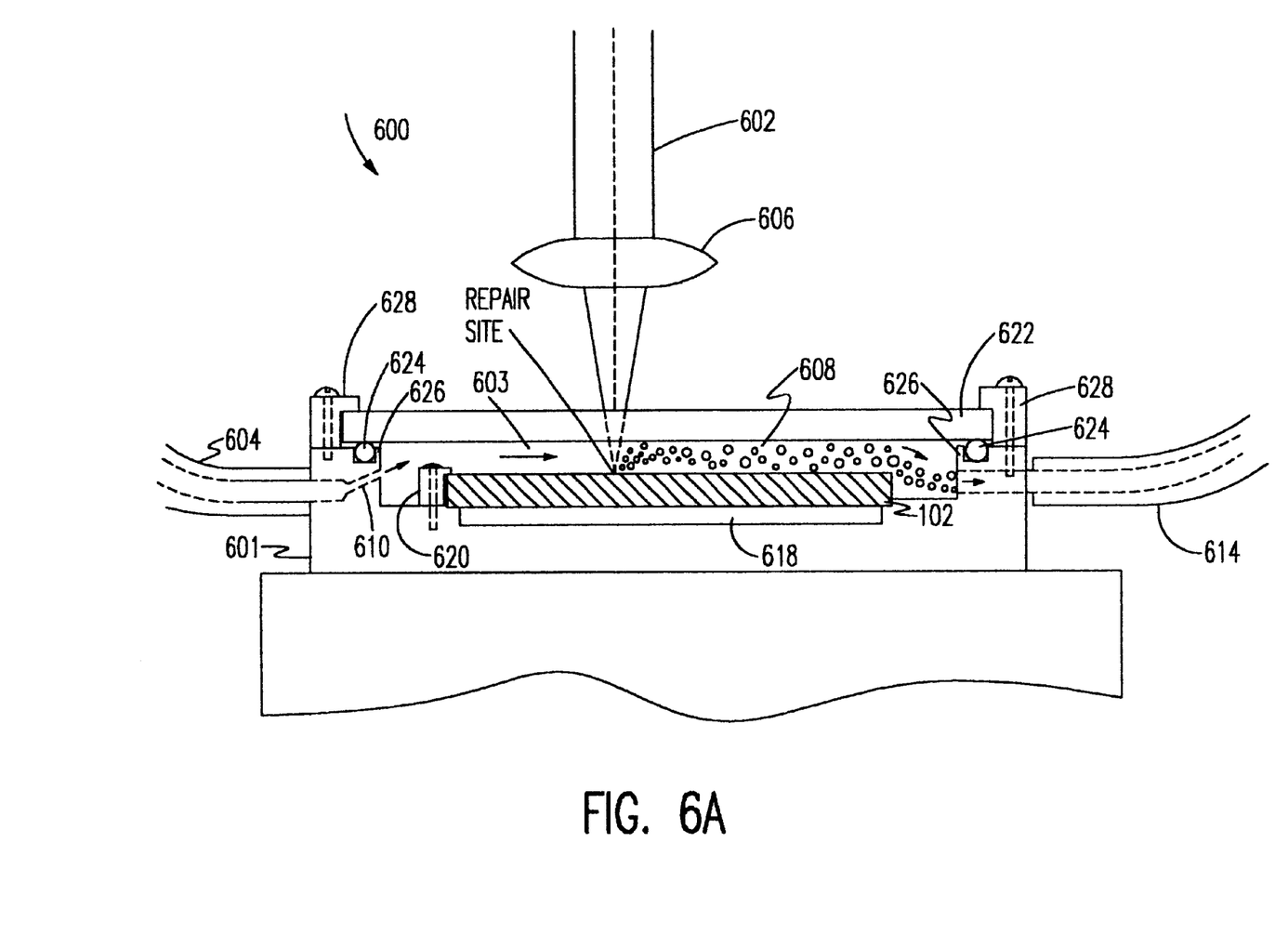
FIG. 6a shows a side view of the laser machining set configuration.
Figure 6B:
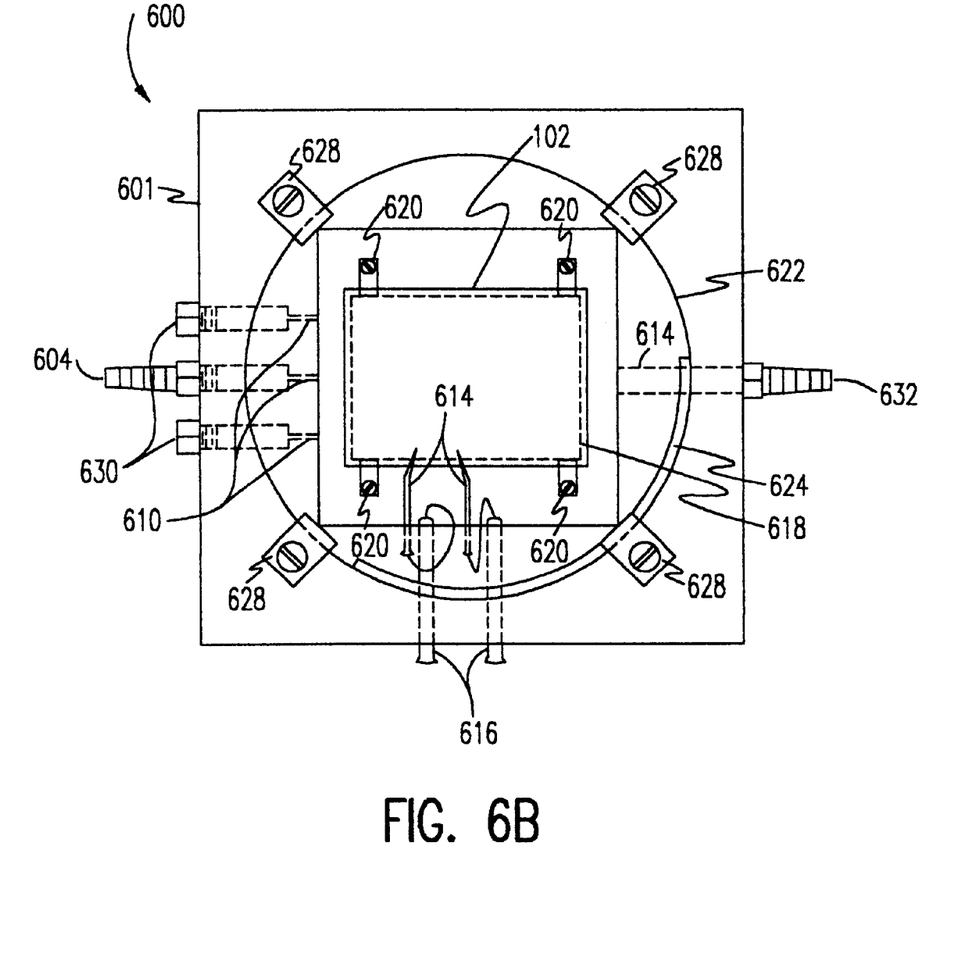
FIG. 6b shows a top view of the laser machining set configuration.

To accomplish the laser machining of step 204, the substrate 102 is placed in a work chamber 600 similar to that shown in FIGS. 6a and 6b. However, it should be understood that for purposes of practicing the invention, work chamber 600 is illustrative only, and that other work chambers having different design characteristics could be used as well.

The present chamber 600 comprises a frame 601 having a supply tube 604 and an exit tube 614 connected thereto. A water return port 632 is attached to the frame 601 for returning water provided from exit tube 614. The supply tube 604 supplies a fluid via nozzles 610 into processing area 603. The substrate 102 is held between the processing area 603 and a pocket area 618 by holding clamps 620. The pocket area holds the air bubbles and conductive debris 608 that is not carried away by exit tube 614. A cover plate 622, preferably made from quartz glass, is placed over an O-ring 624, which is disposed within a slot 626 disposed circumferentially about frame 601. The cover plate 622 is secured to frame 601 by a plurality of securing mechanisms 628. Plugs 630 are provided in frame 101 to plug any nozzles 610 that are not used.

Figure 7:
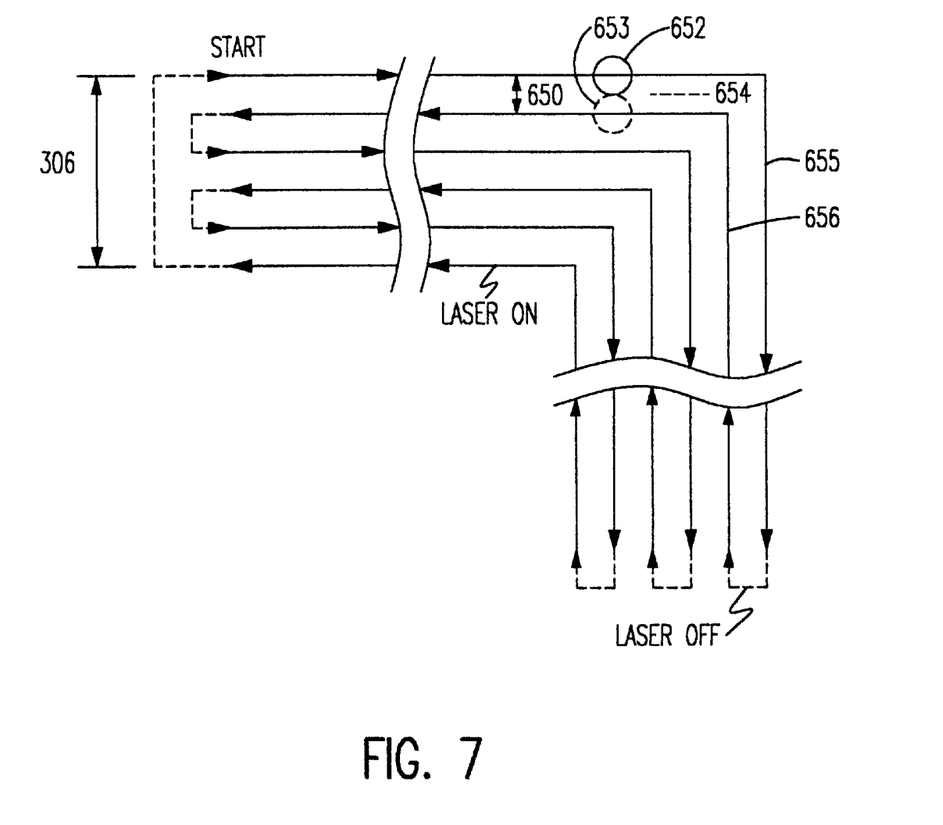
FIG. 7 shows a typical path of the laser during machining.

In performing the laser machining of step 204, it is preferred, but not essential, that the laser beam is translated at a rate of approximately 1.55 mm/sec, over a serpentine pattern similar to that shown in FIG. 7, to produce the desired coil patterns 301, 302. At this rate, it is preferred that a Q-switched or CW Nd:YAG (Neodymum Yttrium Aluminum Garnet) or similar laser be used that generates an average power of approximately 1.1 watts in a Gaussian profile at a second harmonic wavelength of approximately 0.532 $\mu$m at a pulse repetition rate of approximately 1 kHz. It is also preferred that the laser have a spot size 652, 653 of 0.008 mm. Accordingly, nine passes would be required to remove sufficient copper to form a kerf 306, for example, of 0.072 mm, as shown in FIGS. 7 and 3A. The preferred laser system used could be, for example, the commercially available frequency doubled Nd:YAG laser, model 5604, manufactured by US Laser Corp, Wycoff, N.J. Other suitable lasers may also be used. Although the second harmonic of the Nd:YAG laser was used, any suitable wavelength of any suitable laser that exhibits the desired cutting properties can be used. Additionally, a higher powered laser with a multi-mode beam may be used, which would result in higher production rates.

With this or a similar laser beam 602 and an f/2.7, or similar, objective lens 606, approximately 0.008 mm of material are removed per pass 655, 656 given the translation rate of 1.55 mm/sec. In order to achieve a reliable separation 650 (i.e., no copper remains) the laser must be translated over a path similar to the serpentine path shown in FIG. 7. It is preferred that the separation 650 is approximately 0.008 mm, to create a kerf 306 having a total width, for example, of approximately 0.072 mm after nine passes. As shown in FIG. 7, in successive passes, the exposed area of the 0.008 mm focused laser spot 652 of the first path 655 would just meet the exposed area of the laser spot 653 of the return path 656 and would provide continuous coverage over the serpentine path shown in FIG. 7 so that no copper remains after successive passes. The alternating adjacent paths 655 and 656 are repeated side by side until the desired width of the kerf 306, in this case 0.072 mm, or the full width of a kerf 306 having another dimension, is achieved. This serpentine path provides the wider kerf 306 necessary for the removal of air bubbles and conductive debris 608 formed by the laser processing, while the 0.008 mm separation 652, 653 ensures that there is sufficient overlap of the laser beam. The serpentine path shown in FIG. 7 thus provides a means for the laser beam to penetrate to the full depth of the copper coils, 101, 103. It should also be understood that multiple implementations of the serpentine path shown in FIG. 7 will be required over the coils 101, 103 to ultimately produce coils 301 and 302.

In a preferred embodiment of FIGS. 6a and 6b, non-contaminated deionized water is supplied by supply tube 604. The deionized water has a very high resistance (>2×10$^6$ ohms/inch). For the above-identified cutting rate, it is preferred that the deionized water flow at a rate of approximately 1 liter/min through nozzles 610. The nozzles increase the velocity of the water entering the chamber, which aids in sweeping the debris and bubbles 608 created by the laser process out of the path of the incoming laser beam 602. Deionized water is also used both to prevent vaporized metallurgy created by the laser beam 602 from condensing on the side walls of and surface of the copper coils 101, 103. Although deionized water is used in this preferred embodiment, any cooling fluid which possesses the appropriate cooling properties and transparency to the laser wavelength can be used.

End point detection may be used to determine when the copper coils 101, 103 have been sufficiently isolated. For example, non-insulated probes 614 connected to probe contacts 616 may be used to contact the copper coils 101, 103. The laser beam 602 is passed over the desired pattern, which may be the same as or similar to that shown in FIG. 7, a number of times until the probe contacts 616 indicate that the resistance has risen a sufficient amount to indicate that the copper coils 101, 103 have been severed into their desired patterns 301, 302. Alternatively, if no endpoint detection is desired, the laser beam 602 is passed over the desired pattern, which may be the same as or similar to that shown in FIG. 7, a number of times until it is visibly apparent that the copper coils 101, 103 have been severed into their desired patterns 301, 302. In the current embodiment, 20 passes with the above-described laser and associated configuration was used. Following step 204, the patterned substrate is removed from the work chamber and thoroughly dried.

In step 205, a through hole 300 is drilled through substrate 303, which is used to provide an electrical connection between coil patterns 301 and 302. Drilling is preferably done in either the conventional manner or by laser action. Then, in step 206, an electrical connection made between the circuits on either side of the ceramic vane. Alternatively, the electrical connection can be made using the DBC process disclosed in Ser. No. 09/471,613.

FIG. 3 shows the resulting electromagnetic coil vane of the present invention. The termination pad 305 provided on coil patterns 301 and 302 is a terminal portion of the coil wire where electric current is applied to the electromagnetic coil vane. Through hole 300 is drilled or lasered through substrate 102, which provides an electrical connection between coil patterns 301 and 302.

Figure 4:
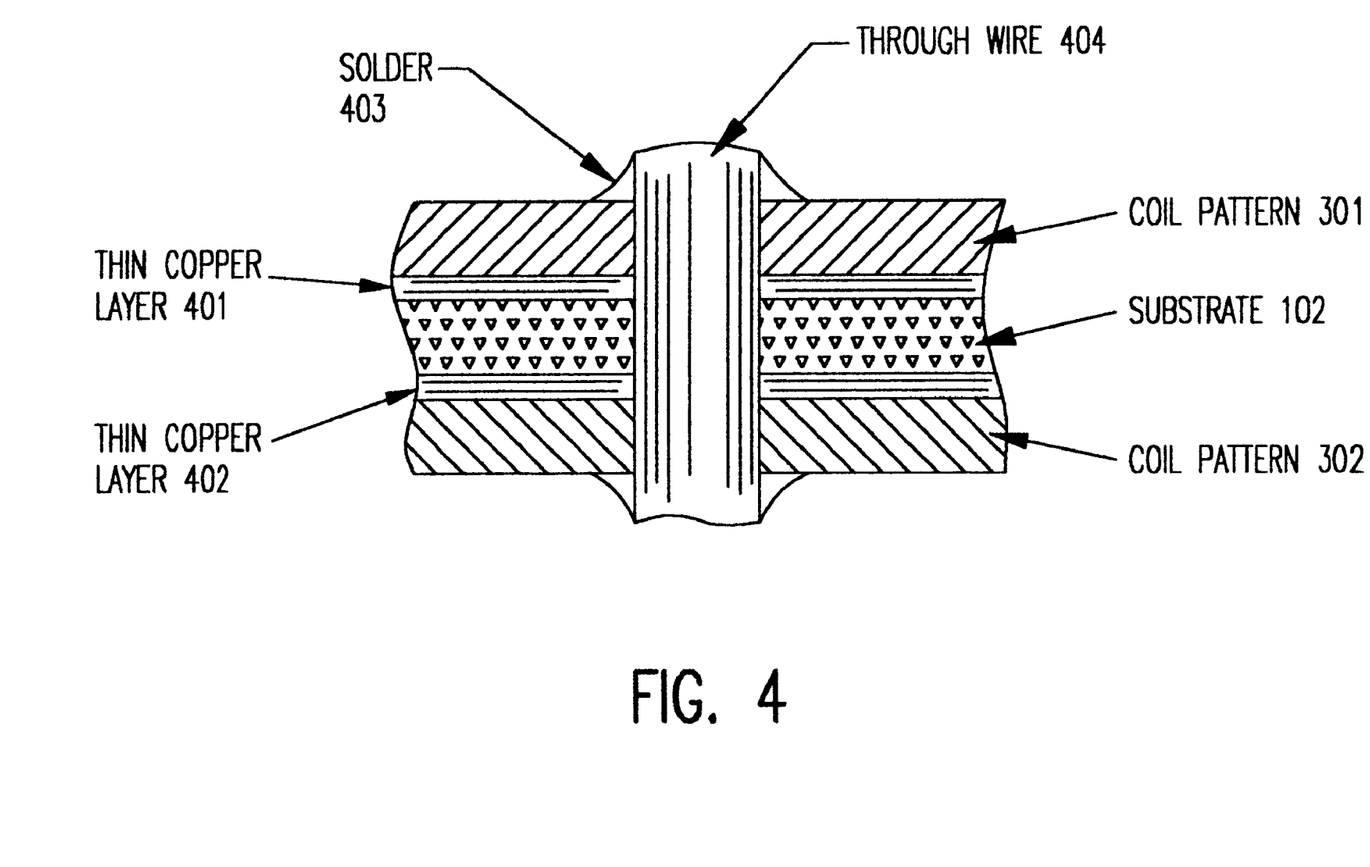
FIG. 4 shows an interconnection between the two coil patterns through the substrate.

As shown in FIG. 4, through wire 404 is placed in the through hole 300 of the substrate 102. The through wire 404 electrically connects coil pattern 301 and coil pattern 302. It is preferred that solder 403 be used to secure and electrically connect the through wire 404 to coil pattern 301 and coil pattern 302. However, other suitable techniques of electrically connecting coil patterns 301 and 302 may also be used. The completed electromagnetic coil vane as shown in FIG. 3 is thus provided.

Figure 5:
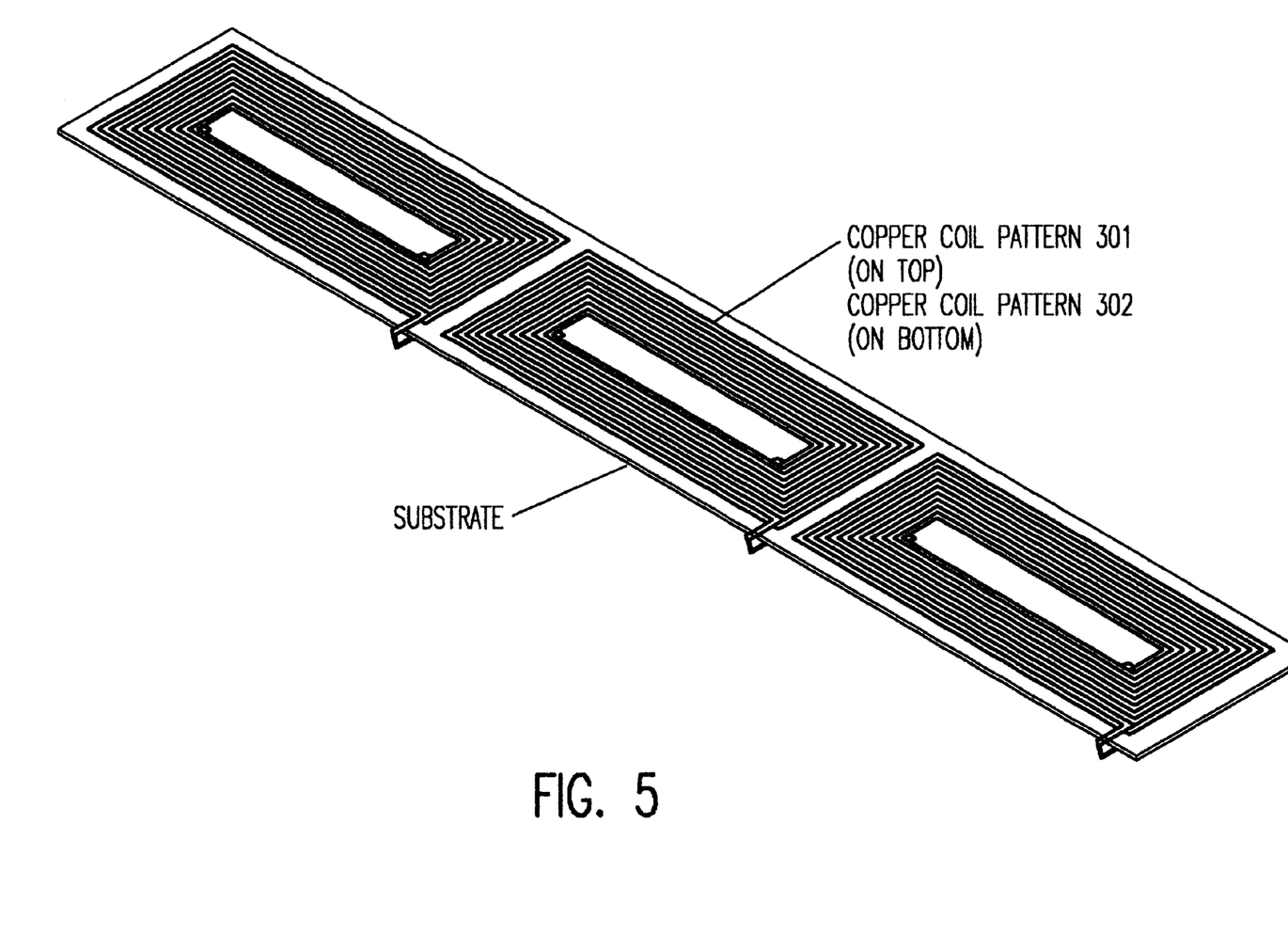
FIG. 5 shows three electromagnetic coil vanes of the present invention.

In view of the foregoing, it is seen that the invention provides a method for fabricating high precision, thermally stable electromagnetic coil vanes. This meritorious effect of the invention will also be produced in variations of the invention. For example, as shown in FIG. 5, the invention can also be practiced by providing a plurality of coil patterns 301 and 302 on each side of substrate 102.

While the invention has been described in terms of preferred embodiments, those skilled in the art will recognize that the invention can be practiced with modification within the spirit and scope of the appended claims.

Having thus described my invention, what I claim as new and desire to secure by Letters Patent is as follows:

1. A method for fabricating high precision, thermally stable electromagnetic coil vanes, comprising the steps of:

placing sheets of metal over opposing surfaces of a substrate;

bonding the sheets of metal to the substrate;

performing a laser machining operation on the sheets of metal to form wire patterns;

drilling a through hole in the substrate; and forming an electrical connection between the sheets of metal on the opposing surfaces of the substrate.

2. The method as recited in claim 1, wherein said bonding includes heating the substrate and sheets of metal to form a eutectic bond.

3. The method as recited in claim 2, wherein the heating step is done at a temperature substantially equal to the melting point of a eutectic composition of copper and an oxide of copper.

4. The method as recited in claim 3, wherein the eutectic bond is formed in an inert environment.

5. The method as recited in claim 1, wherein said substrate has a coefficient of thermal expansion which is less that $7 \times 10^{-6}/°C$.

6. The method as recited in claim 4, wherein said substrate has a coefficient of thermal expansion which is less that $7 \times 10^{-6}/°C$.

7. The method of claim 1, wherein said substrate is a ceramic.

8. The method of claim 7, wherein said substrate is alumina.

9. The method as recited in claim 2, wherein the eutectic bond is formed at a temperature between 1065° C. and 1083° C.

10. A method as recited in claim 1, wherein the wire patterns have a ratio of a wire width to a gap between the wire patterns of at least 4:1.

11. The method as recited in claim 10, wherein the gap is approximately 0.07 millimeters.

12. The method as recited in claim 1, wherein the sheets of metal comprise copper.

13. The method as recited in claim 1, wherein the sheets of metal comprise silver.

14. The method as recited in claim 1, wherein a thickness of the sheets of metal is approximately 0.5 mm.

15. The method as recited in claim 1, wherein the laser machining step comprises the steps of:

focusing a laser beam at least one of the metal sheets;

translating the laser beam over at least one of the metal sheets; and removing and drying the substrate.

16. The method as recited in claim 15, wherein the translating is done in a serpentine pattern.

17. The method as recited in claim 1, wherein a thickness of said substrate is equal to or less than 0.64 mm.

* * * * *